(12) United States Patent
Kim

(10) Patent No.: US 7,763,482 B2
(45) Date of Patent: Jul. 27, 2010

(54) METHOD OF FABRICATING ARRAY SUBSTRATE FOR LIQUID CRYSTAL DISPLAY DEVICE

(75) Inventor: Jin-Wuk Kim, Uiwang-si (KR)

(73) Assignee: LG. Display Co., Ltd., Seoul (KR)

( * ) Notice: Subject to any disclaimer, the term of this patent is extended or adjusted under 35 U.S.C. 154(b) by 126 days.

(21) Appl. No.: 11/967,636

(22) Filed: Dec. 31, 2007

(65) Prior Publication Data

US 2008/0227244 A1    Sep. 18, 2008

(30) Foreign Application Priority Data

Mar. 13, 2007   (KR) ...................... 10-2007-0024340

(51) Int. Cl.
*H01L 21/4763* (2006.01)
*H01L 21/84* (2006.01)

(52) U.S. Cl. .................... 438/30; 438/675; 438/759; 438/781; 257/E21.492; 977/887

(58) Field of Classification Search ................ 438/759; 257/E21.492; 977/887
See application file for complete search history.

(56) References Cited

U.S. PATENT DOCUMENTS

| | | | |
|---|---|---|---|
| 7,122,482 B2 * | 10/2006 | Xu et al. ...................... | 438/738 |
| 2003/0219920 A1 * | 11/2003 | Baek et al. .................... | 438/30 |
| 2005/0266693 A1 * | 12/2005 | Maekawa ................... | 438/720 |
| 2007/0262936 A1 * | 11/2007 | Chang et al. .................. | 345/87 |

* cited by examiner

*Primary Examiner*—Stephen W Smoot
(74) *Attorney, Agent, or Firm*—Brinks Hofer Gilson & Lione

(57) ABSTRACT

A method of fabricating an array substrate for a liquid crystal display device comprises forming a gate line, a data line that crosses the gate line and a thin film transistor connected to the gate line and the data line on a substrate, and forming an organic insulating material layer on the gate line, the data line and the thin film transistor. The organic insulating material layer has photo curability, flexibility and dynamic stability. The method further comprises forming a passivation layer that has a drain contact hole from the organic insulating material layer by using a stamp that has a convex portion. The drain contact hole exposes a drain electrode of the thin film transistor. The method also comprises forming a pixel electrode on the passivation layer. The pixel electrode is connected to the drain electrode through the drain contact hole.

24 Claims, 14 Drawing Sheets

METHOD OF FABRICATING ARRAY SUBSTRATE FOR LIQUID CRYSTAL DISPLAY DEVICE

This application claims the benefit of Korean Patent Application No. 2007-0024340, filed in Korea on Mar. 13, 2007, the entirety of which is hereby incorporated by reference.

FIELD OF THE INVENTION

The present invention relates to a liquid crystal display device, and more particularly, to a method of fabricating an array substrate for a liquid crystal display device.

BACKGROUND OF THE INVENTION

Until recently, display devices have typically used cathode-ray tubes (CRTs). More recently, considerable effort has been expended to research and develop thin film transistor liquid crystal display (TFT-LCD) devices having thin profiles, light weight and low power consumption as substitutes for CRTs.

Liquid crystal display (LCD) devices use the optical anisotropy and polarization properties of liquid crystal molecules of a liquid crystal layer to produce an image. The liquid crystal molecules have long and thin shapes. Because of the optical anisotropy property, the polarization of light varies with the alignment direction of the liquid crystal molecules. The alignment direction of the liquid crystal molecules can be controlled by varying the intensity of an electric field applied to the liquid crystal layer. Accordingly, a typical LCD device includes two substrates spaced apart and facing each other and a liquid crystal layer interposed between the two substrates. Each of the two substrates includes an electrode on a surface facing the other of the two substrates. A voltage is applied to each electrode to induce an electric field between the electrodes. The arrangement of the liquid crystal molecules as well as the transmittance of light through the liquid crystal layer is controlled by varying the intensity of the electric field. LCD devices are non-emissive type display devices that employ a light source to display images using the change in light transmittance.

Among the various types of LCD devices, active matrix LCD (AM-LCD) devices that employ switching elements and pixel electrodes arranged in a matrix structure are the subject of significant research and development because of their high resolution and superior suitability for displaying moving images. Thin film transistor LCD (TFT-LCD) devices use thin film transistors (TFTs) as the switching elements.

FIG. 1 is a perspective view of an LCD device according to the related art. As shown in FIG. 1, the LCD device of the related art includes a first substrate 10, a second substrate 20 and a liquid crystal layer 30. The first substrate 10 is referred to as an array substrate and includes a gate line 14 and a data line 16 crossing each other to define a pixel region P. A pixel electrode 18 and a thin film transistor (TFT) Tr, as a switching element, are positioned in each pixel region P. Thin film transistors T, which are disposed adjacent to crossings of the gate lines 14 and the data lines 16 are disposed in a matrix on the first substrate 10. The second substrate 20 is referred to as a color filter substrate, and includes color filter layer 26 including red (R), green (G) and blue (B) color filters 26a, 26b and 26c, a black matrix 25 between the red, green and blue color filters 26a, 26b and 26c and a common electrode 28 on both the color filter layer 26 and the black matrix 25.

Although not shown in FIG. 1, the first and second substrates 10 and 20 are attached with a seal pattern to prevent leakage of liquid crystal layer 30. In addition, a first alignment layer is formed between the first substrate 10 and the liquid crystal layer 30 and a second alignment layer is formed between the second substrate 20 and the liquid crystal layer 30 to align the liquid crystal molecules in the liquid crystal layer 30 along an initial alignment direction. A polarization plate is formed on an outer surface of at least one of the first and second substrates 10 and 20.

Further, a backlight unit (not shown) disposed under the first substrate 10 supplies light. A gate signal turning the TFT Tr on is sequentially applied to each of the gate lines 14, and an image signal on the data line 16 is applied to the pixel electrode 18 in the pixel region P. The liquid crystal molecules in the liquid crystal layer 30 are driven by a vertical electric field generated between the pixel electrode 18 and the common electrode 28 to display images by varying the light transmittance of the liquid crystal molecules.

FIG. 2 is a cross-sectional view illustrating an array substrate for an LCD device according to the related art. In FIG. 2, a gate electrode 60 is formed on a substrate 59 having a pixel region P defined by a gate line (not shown) and a data line (not shown). A gate insulating layer 68 is formed on the gate electrode 60, and a semiconductor layer 70 including an active layer 70a and an ohmic contact layer 70b is formed on the gate insulating layer 68 over the gate electrode 60. Source and drain electrodes 76 and 78 spaced apart from each other are formed on the ohmic contact layer 70b. After the semiconductor layer 70 is patterned through a single mask process, a metallic material layer on the semiconductor layer 70 is patterned through a different mask process to form the source and drain electrodes 76 and 78. As a result, the source and drain electrodes 76 and 78 completely cover end portions of the semiconductor layer 70. In addition, a passivation layer 86 is formed on the source and drain electrodes 76 and 78. The passivation layer 86 includes a drain contact hole 80 exposing the drain electrode 78. A pixel electrode 88 is formed on the passivation layer 86 in the pixel region P. The pixel electrode 88 is connected to the drain electrode 78 through the drain contact hole 80.

Patterns of an array substrate for an LCD device are formed through a photolithographic process using a photoresist (PR) of a photosensitive material. The photolithographic process includes a step of coating a PR on one of a metallic material layer, an insulating material layer and a semiconductor material layer, a step of exposing a PR layer through a photo mask, a step of developing the exposed PR layer to form a PR pattern, a step of etching the one of the metallic material layer, the insulating material layer and the semiconductor material layer using the PR pattern as an etch mask to form a line, an electrode, a contact hole or a semiconductor pattern. Since the number of the photolithographic process for fabricating an array substrate is determined by the number of the masks, the photolithographic process may be referred to as a mask process.

The mask process includes deposition, exposing, developing and etching processes each requiring a respective apparatus. In addition, physical and chemical fabrication steps are repeated in the mask process. As a result, the mask process for an LCD device requires a relatively high fabrication expenses.

SUMMARY

In one embodiment, a method of fabricating an array substrate for a liquid crystal display device comprises forming a gate line, a data line that crosses the gate line and a thin film transistor connected to the gate line and the data line on a substrate, and forming an organic insulating material layer on the gate line, the data line and the thin film transistor. The organic insulating material layer has photo curability, flexibility and dynamic stability. The method further comprises forming a passivation layer that has a drain contact hole from the organic insulating material layer by using a stamp that has a convex portion. The drain contact hole exposes a drain electrode of the thin film transistor. The method also comprises forming a pixel electrode on the passivation layer. The pixel electrode is connected to the drain electrode through the drain contact hole.

In another embodiment, a method of fabricating an array substrate for a liquid crystal display device comprises forming a gate line, a data line that crosses the gate line and a thin film transistor connected to the gate line and the data line on a substrate, forming an inorganic insulating material layer on the gate line, the data line and the thin film transistor, and forming a photoresist layer on the inorganic insulating material layer. The method further comprises forming an opening in the photoresist layer by using a stamp that has a convex portion, and patterning the inorganic insulating material layer using the photoresist layer with the opening as an etch mask to form a passivation layer that has a drain contact hole. The drain contact hole exposes a drain electrode of the thin film transistor. The method also comprises removing the photoresist layer, and forming a pixel electrode on the passivation layer. The pixel electrode is connected to the drain electrode through the drain contact hole.

In yet another embodiment, a method of forming a hole in a layer comprises forming an organic insulating material layer on a substrate. The organic insulating material layer has photo curability, flexibility and dynamic stability. The method further comprises contacting a stamp that has a convex portion and the organic insulating material layer to push out the organic insulating material layer from the convex portion, and removing the stamp from the organic insulating material layer.

In still another embodiment, a method of forming a hole in a layer comprises forming an inorganic insulating material layer on a substrate, forming a photoresist layer on the inorganic insulating material layer, and forming an opening in the photoresist layer by using a stamp that has a convex portion. The method further comprises patterning the inorganic insulating material layer using the photoresist layer with the opening as an etch mask, and removing the photoresist layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

In one embodiment of the present invention, a contact hole is formed in an insulating layer through an in-plane printing method where a stamp having a convex portion contacts the insulating layer and then a pressure is added to the stamp without using a mask process including an exposure, a development and a strip. A method of forming a hole through an in-plane printing method will be illustrated hereinafter.

An insulating layer may be classified into an organic insulating layer and an inorganic insulating layer, and a method of forming a hole in the insulating layer may be divided according to a material for the insulating layer. A stamp, which may be referred to as a mold, having a convex portion may directly contact the organic insulating layer formed by coating before a curing step is performed for the organic insulating layer, thereby forming a hole in the organic insulating layer. However, a hole can not be formed in an inorganic insulating layer formed by deposition by contact of the stamp and the inorganic insulating layer. Accordingly, after a photoresist (PR) layer of an organic material is formed on the inorganic insulating layer by coating, the stamp contacts the PR layer to form a hole in the PR layer. Next, the PR layer having the hole is cured and the inorganic insulating layer is dry-etched using the PR layer as an etch mask to form a hole in the inorganic insulating layer. Since an exposure step using a photo mask and an exposure apparatus are not required for the process of forming a hole in the inorganic insulating layer, a production cost is reduced. In addition, since the stamp contacts a layer of an organic material to form a hole both in an organic insulating layer and in an inorganic insulating layer, a method of forming a hole in an organic insulating layer will be exemplary illustrated hereinafter.

Figure 1:
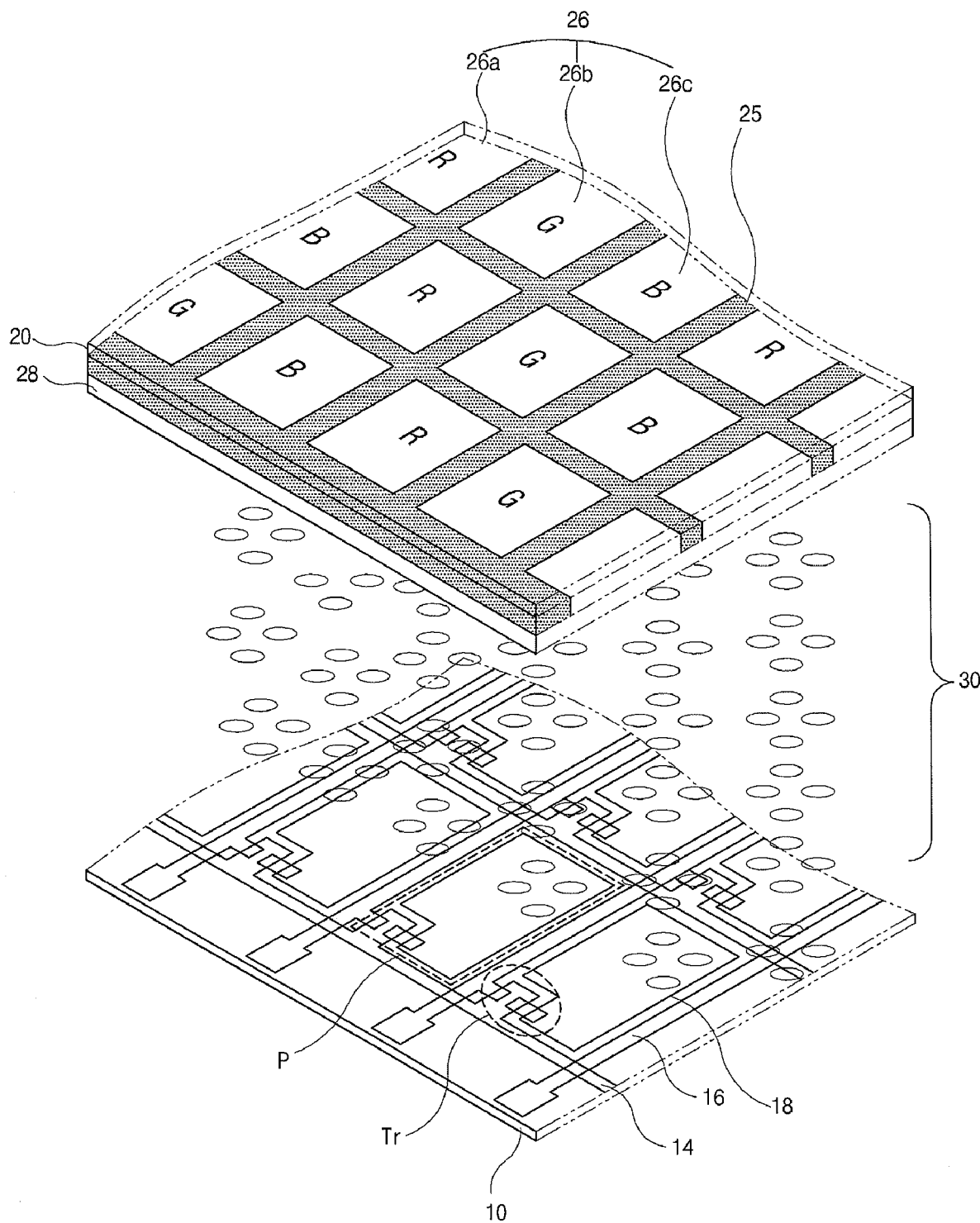
FIG. 1 is a perspective view of an LCD device according to the related art.
Figure 2:
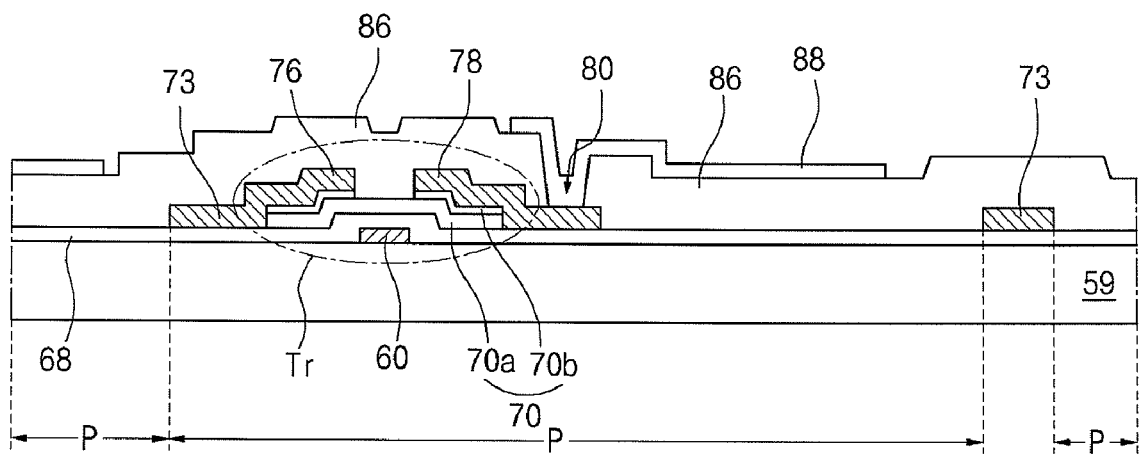
FIG. 2 is a cross-sectional view illustrating an array substrate for an LCD device according to the related art.
Figure 3:
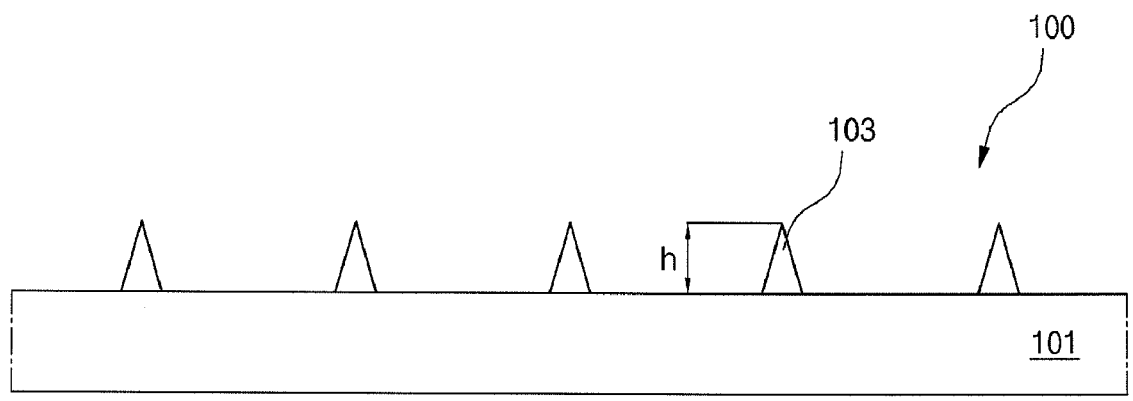
FIG. 3 is a cross-sectional view illustrating a hard type stamp used in a method of fabricating an array substrate for an LCD device according to an embodiment of the present invention.
Figure 4A:
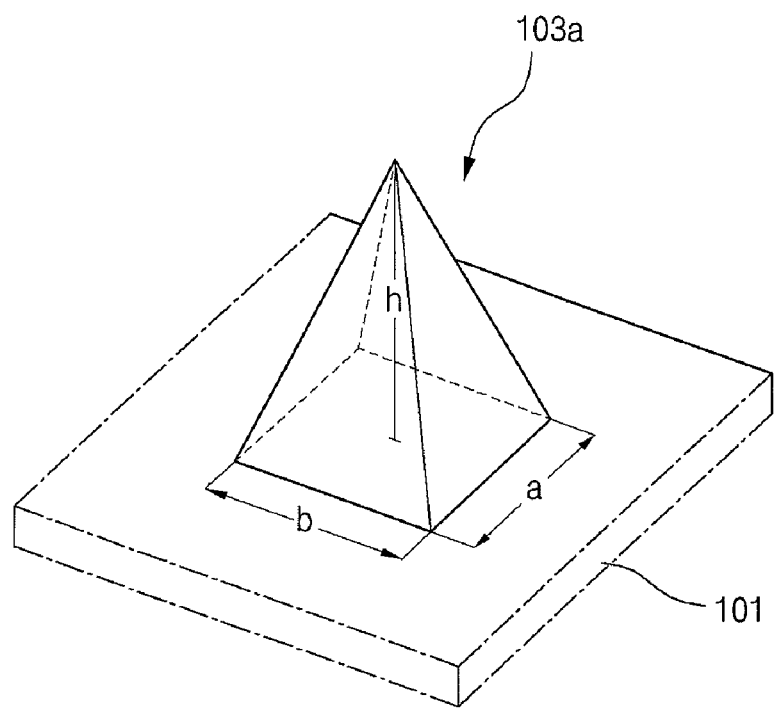
FIGS. 4A to 4C are perspective views illustrating convex portions of a hard type stamp used in a method of fabricating an array substrate for an LCD device according to an embodiment of the present invention.
Figure 4B:
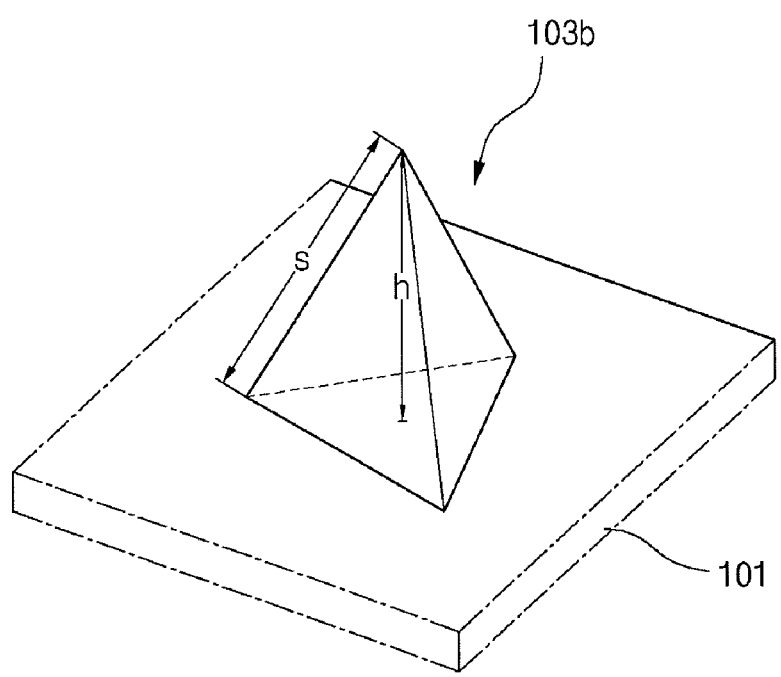
Figure 4C:
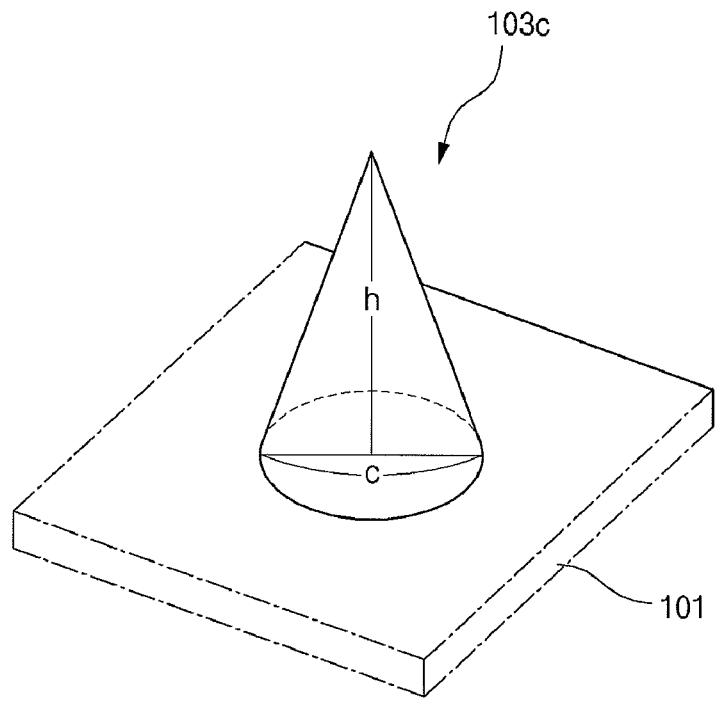

FIG. 3 is a cross-sectional view illustrating a hard type stamp used in a method of fabricating an array substrate for an LCD device according to an embodiment of the present invention, and FIGS. 4A to 4C are perspective views illustrating convex portions of a hard type stamp used in a method of fabricating an array substrate for an LCD device according to an embodiment of the present invention.

In FIG. 3, a hard type stamp 100 includes a base substrate 101 having a plate shape and a plurality of convex portions 103 spaced apart from each other. Each of the plurality of convex portions 103 has a triangular shape in a cross-sectional view. The base substrate 101 includes a transparent hard material such as glass, quartz and polyurethane acrylate (PUA), and each of the plurality of convex portions 103 has the same material as the base substrate 101.

As shown in FIGS. 4A to 4C, each convex portion 103 (of FIG. 3) may have one of a quadrangular pyramid shape 103a, a triangular pyramid shape 103b or a cone shape 103c. The triangular pyramid shape 103b may be a regular tetrahedron. A summit of each convex portion is disposed opposite to the base substrate 101.

A height h of each convex portion 103 may have various relations with a thickness d of an organic insulating layer where a hole is formed through an in-plane printing method according to a shape of each convex portion 103. As the convex portion 103 is inserted into the organic insulating layer, organic insulating materials corresponding to the convex portion 103 are moved aside and a thickness d of the organic insulating layer increases. If the convex portion 103 of the stamp 100 has a relatively small height, a top surface of the organic insulating layer contacts the base substrate 101 of the stamp 100 before the summit of the convex portion 103 reaches a bottom surface of the organic insulating layer. After the top surface of the organic insulating layer contacts the base substrate 101 of the stamp 100, the convex portion 103 of the stamp 100 is not inserted into the organic insulating layer any more and the summit of the convex portion 103 does not contact a layer, for example, a drain electrode, under the organic insulating layer. As a result, a dewetting phenomenon does not occur and a hole is not formed in the organic insulating layer. Therefore, the convex portion 103 of the stamp 100 has a height greater than a reference value according to the shape thereof to form a hole in the organic insulating layer.

When the convex portion 103 has a first volume V1 and a virtual portion of the organic insulating layer that is defined by a minimum rectangular parallelepiped capable of containing the convex portion 103 has a second volume V2, a relation that the first volume is greater than the second volume (V1>V2) is experimentally obtained to form a hole in the organic insulating layer.

In FIG. 4A, the convex portion 103 having the quadrangular pyramid shape 103a has a width a, a length b and a height h, and an organic insulating layer has a thickness d. The first volume V1 of the convex portion 103 having the quadrangular pyramid shape 103a is abh/3 and the second volume V2 of the virtual portion is abd. As a result, a relation between the height h of the convex portion 103 and the thickness d of the organic insulating layer is obtained as h>3d (equation 1) from the relation between the first and second volumes of V1>V2. Accordingly, a hole is stably formed in the inorganic insulating layer through an in-plane printing method using when the convex portion 103 having the height h greater than three times of the thickness d of the organic insulating layer.

In FIG. 4B, the convex portion 103 having the regular tetrahedron shape 103b has a side s and a height h, and an organic insulating layer has a thickness d. Since the height h of the convex portion is $\sqrt{(6)}s/3$, the first volume V1 of the convex portion 103 having the regular tetrahedron shape 103b is $\sqrt{(12)}s^3/3$. Since the second volume V2 of the virtual portion is $\sqrt{(3)}s^2d/2$, a relation between the side s of the convex portion 103 and the thickness d of the organic insulating layer is obtained as $s>3\sqrt{(6)}d$ (equation 2) from the relation between the first and second volumes of V1>V2. Accordingly, a hole is stably formed in the inorganic insulating layer through an in-plane printing method using when the convex portion 103 having the side s greater than $3\sqrt{(6)}$ times of the thickness d of the organic insulating layer.

In FIG. 4C, the convex portion 103 having the cone shape 103c has a diameter c and a height h, and an organic insulating layer has a thickness d. The first volume V1 of the convex portion 103 having the cone shape 103c is $\pi c^2 h/12$ and the second volume V2 of the virtual portion is $c^2 d$. As a result, a relation between the height h of the convex portion 103 and the thickness d of the organic insulating layer is obtained as h>12d$\pi$ (equation 3) from the relation between the first and second volumes of V1>V2. Accordingly, a hole is stably formed in the inorganic insulating layer through an in-plane printing method using when the convex portion 103 having the height h greater than $12/\pi$ times of the thickness d of the organic insulating layer.

Figure 5:
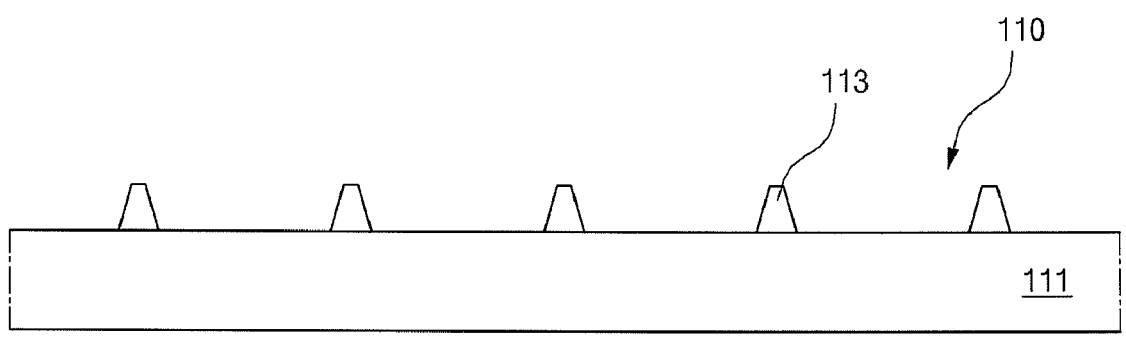
FIG. 5 is a cross-sectional view illustrating a soft type stamp used in a method of fabricating an array substrate for an LCD device according to an embodiment of the present invention.
Figure 6A:
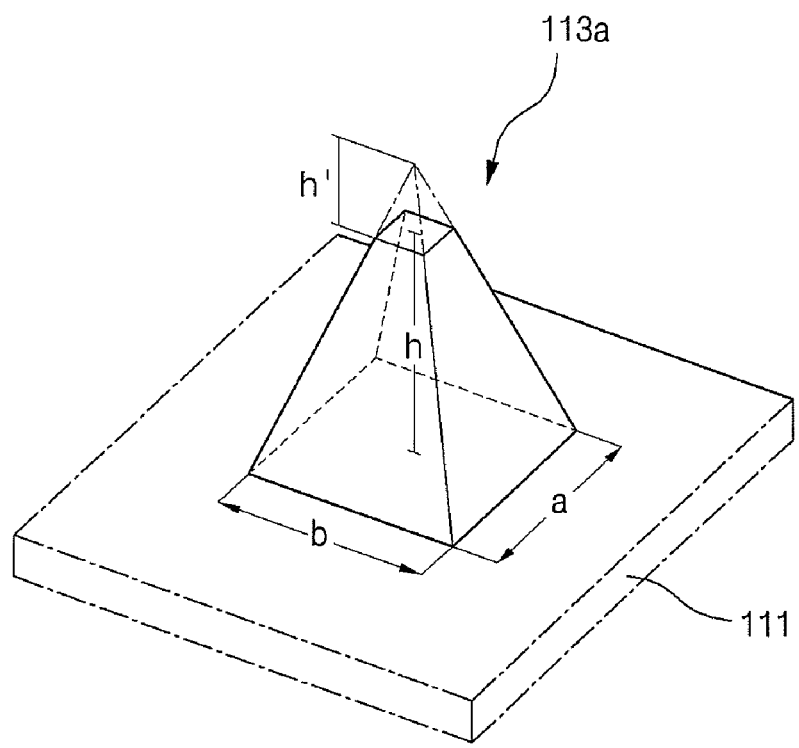
FIGS. 6A to 6C are perspective views illustrating convex portions of a soft type stamp used in a method of fabricating an array substrate for an LCD device according to an embodiment of the present invention.
Figure 6B:
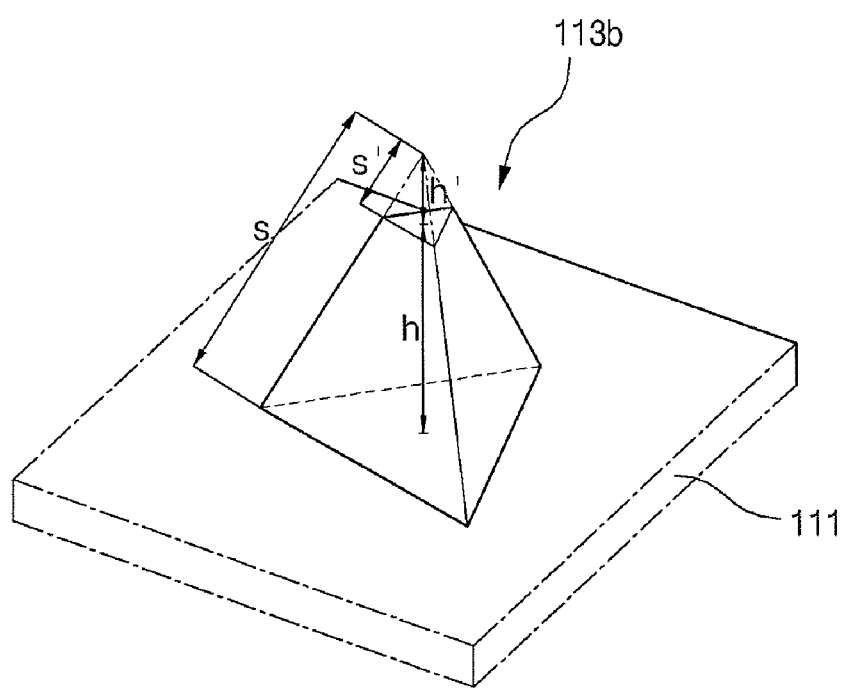
Figure 6C:
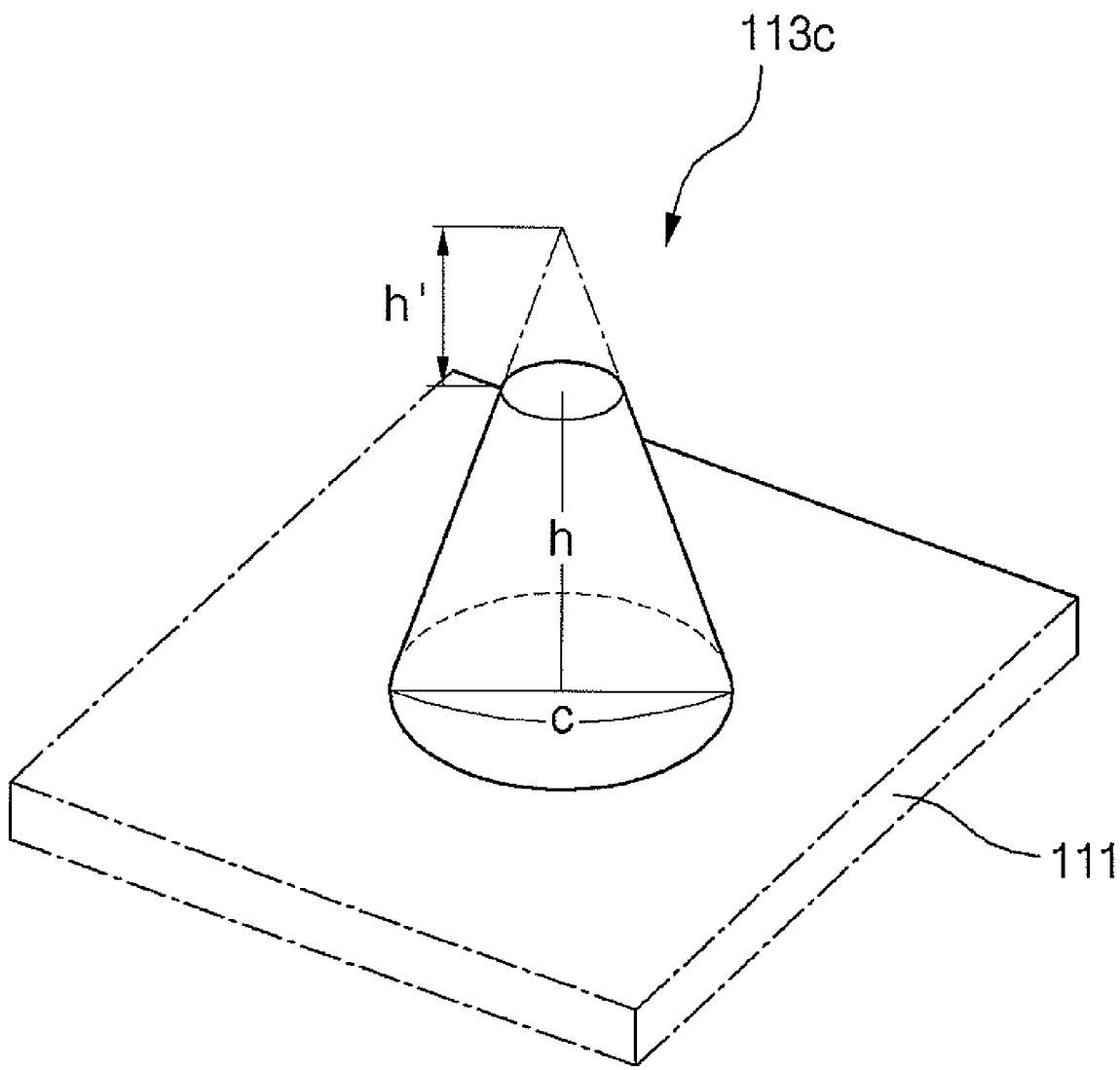

FIG. 5 is a cross-sectional view illustrating a soft type stamp used in a method of fabricating an array substrate for an LCD device according to an embodiment of the present invention, and FIGS. 6A to 6C are perspective views illustrating convex portions of a soft type stamp used in a method of fabricating an array substrate for an LCD device according to an embodiment of the present invention.

In FIG. 5, a soft type stamp 110 includes a base substrate 111 having a plate shape and a plurality of convex portions 113 spaced apart from each other. Each of the plurality of convex portions 113 has a trapezoidal shape in a cross-sectional view. The base substrate 111 includes a transparent hard material such as glass, quartz and polyurethane acrylate (PUA), and each of the plurality of convex portions 113 includes an elastic material such as transparent polyurethane and polydimethylsiloxane (PDMS).

As shown in FIGS. 6A to 6C, each convex portion 113 (of FIG. 5) may have one of a truncated quadrangular pyramid shape 113a, a truncated triangular pyramid shape 113b and a truncated cone shape 113c. Although not shown, each convex portion 113 may have one of a quadrangular pyramid shape, a triangular pyramid shape or a cone shape. The triangular pyramid shape may be a regular tetrahedron. A summit of each convex portion is disposed opposite to the base substrate 111. A sharp summit of a convex portion having one of a quadrangular pyramid shape, a triangular pyramid shape and a cone shape may be warped due to pressurization during an in-plane printing process and a position and a size of a hole may be changed. The above problems may be solved by using a convex portion having one of the truncated quadrangular pyramid shape 113a, the truncated triangular pyramid shape 113b or the truncated cone shape 113c.

A height h of each convex portion 113 may have a relation with a thickness d of an organic insulating layer where a hole is formed through an in-plane printing method. As the convex portion 113 is inserted into the organic insulating layer, organic insulating materials corresponding to the convex portion 113 are moved aside and a thickness d of the organic insulating layer increases. If the convex portion 113 of the stamp 110 has a relatively small height, a top surface of the organic insulating layer contacts the base substrate 111 of the stamp 110 before the summit of the convex portion 113 reaches a bottom surface of the organic insulating layer. After the top surface of the organic insulating layer contacts the base substrate 111 of the stamp 110, the stamp 100 is downwardly pressurized with a pressure of about 5 ATM to about 10 ATM so that the summit of the convex portion 113 can reach the bottom surface of the organic insulating layer. When the hard type stamp is downwardly pressurized with a pressure over that by a mass of the hard type stamp, the convex portion deteriorates a layer under the organic insulating layer.

However, since the convex portion 113 of the soft type stamp 110 is formed of an elastic material softer than a material for elements of an array substrate, a layer such as a drain electrode under the organic insulating layer is not deteriorated by the convex portion 113 even when the stamp is downwardly pressurized. Accordingly, the summit of the convex portion 113 contacts the layer under the organic insulating layer by pressuring the stamp 110 downwardly. As a result, a dewetting occurs and a hole is stably formed in the organic insulating layer by the convex portion 113 having a height h greater than a thickness d of the organic insulating layer (h>d) regardless of the shape of the convex portion 113. The surplus organic materials due to permeation of the convex portion 113 may flow down through sides of an array substrate.

The relation between the height of the convex portion and the thickness of the organic insulating layer (h>d) may be identically applied to the convex portion of truncated shape and of a pyramid shape. To form a hole, the convex portion 113 of the truncated quadrangular pyramid shape 113a of FIG. 6A may have a height h greater than a thickness d of the organic insulating layer. Further, a hole may be stably formed in the organic insulating layer with the convex portion of a quadrangular pyramid shape (not shown) having a height h+h' greater than a thickness d of the organic insulating layer (h+h'>d) due to the elasticity of the convex portion. Similarly, the convex portion 113 of the truncated triangular pyramid shape 113b of FIG. 6B and the truncated cone shape 113c of FIG. 6C may have a height h greater than a thickness d of the organic insulating layer to form a hole in the organic insulating layer. In addition, a hole may be stably formed in the organic insulating layer with the convex portion of a triangular pyramid shape (not shown) and of a cone shape (not shown) having a height h+h' greater than a thickness d of the organic insulating layer (h+h'>d) due to the elasticity of the convex portion.

Figure 7A:
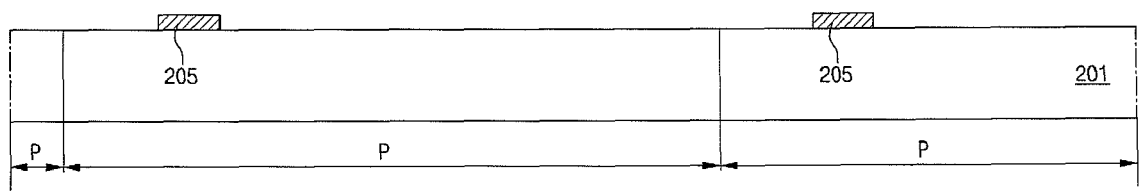
FIGS. 7A to 7H are cross-sectional views illustrating a method of fabricating an array substrate for an LCD device according to an embodiment of the present invention.
Figure 7B:
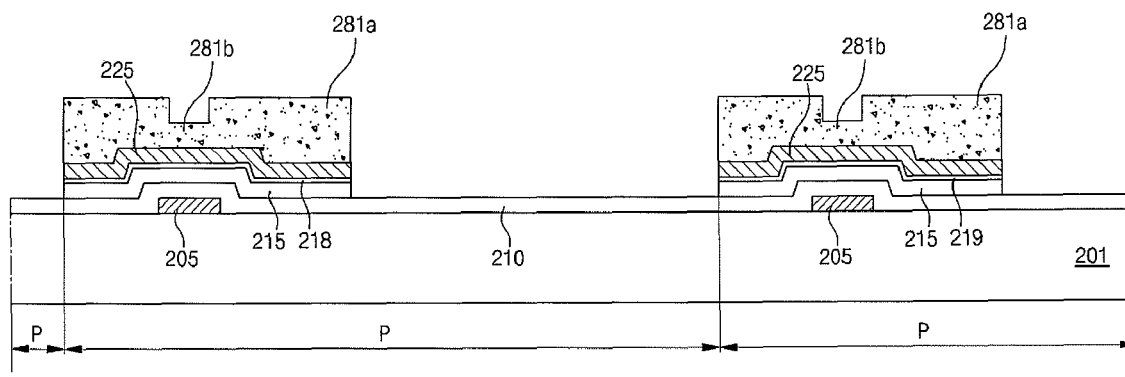
Figure 7C:
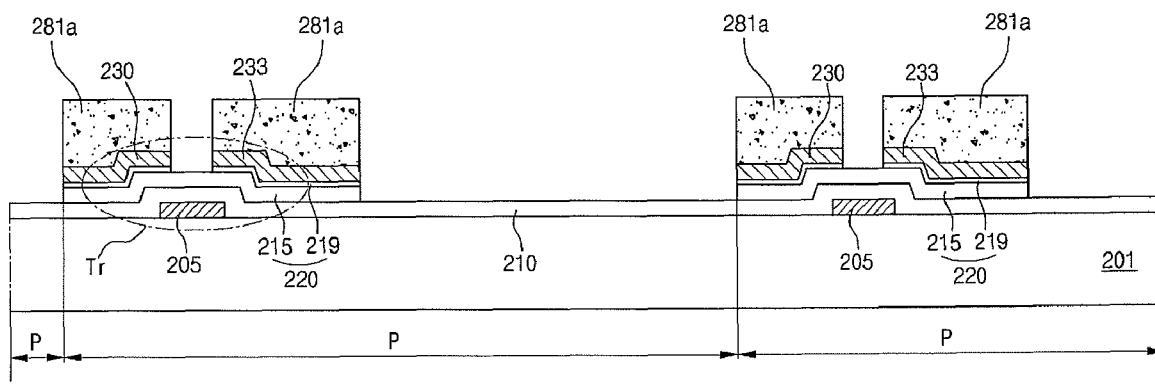
Figure 7D:
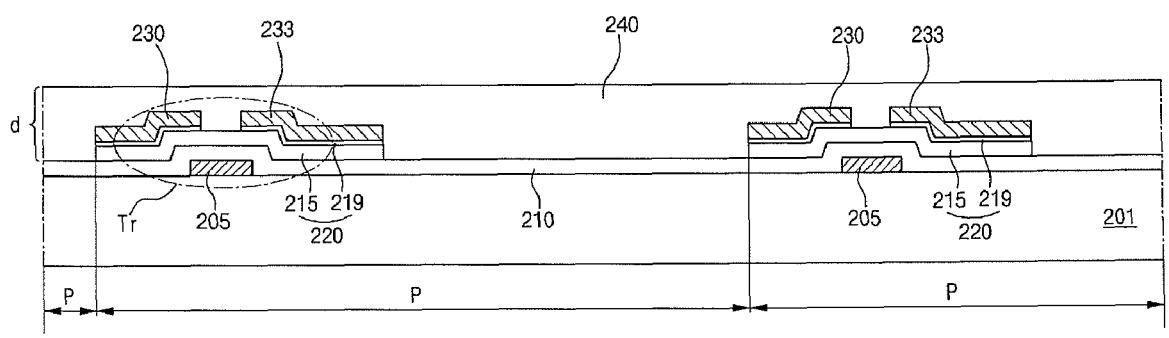
Figure 7E:
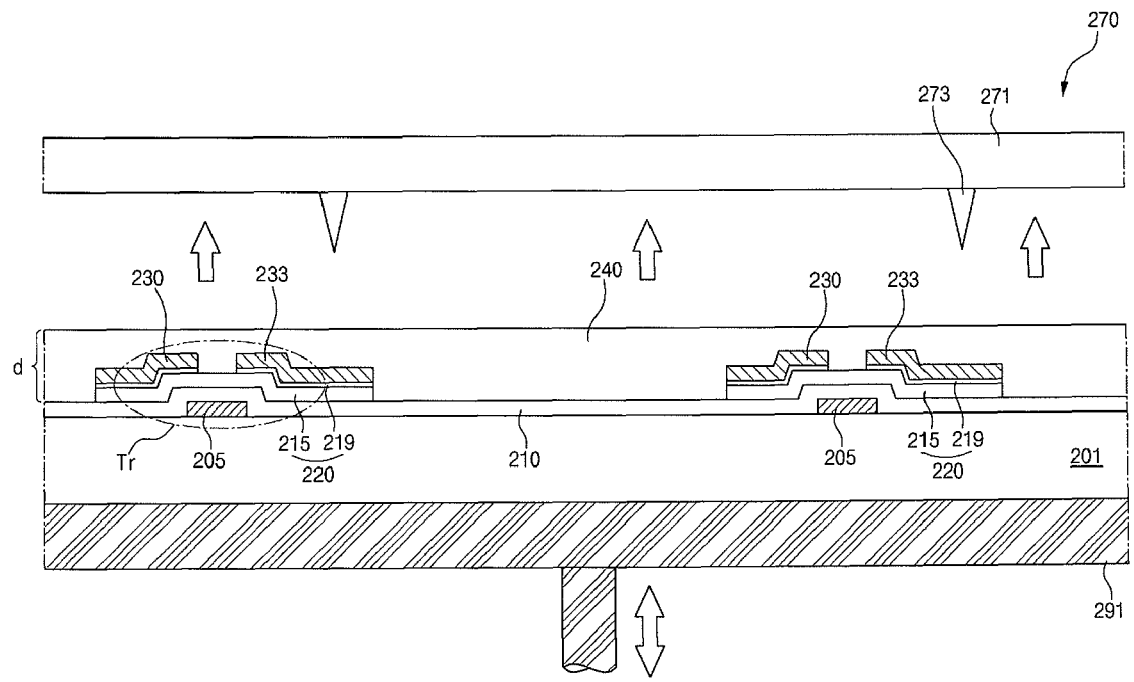
Figure 7F:
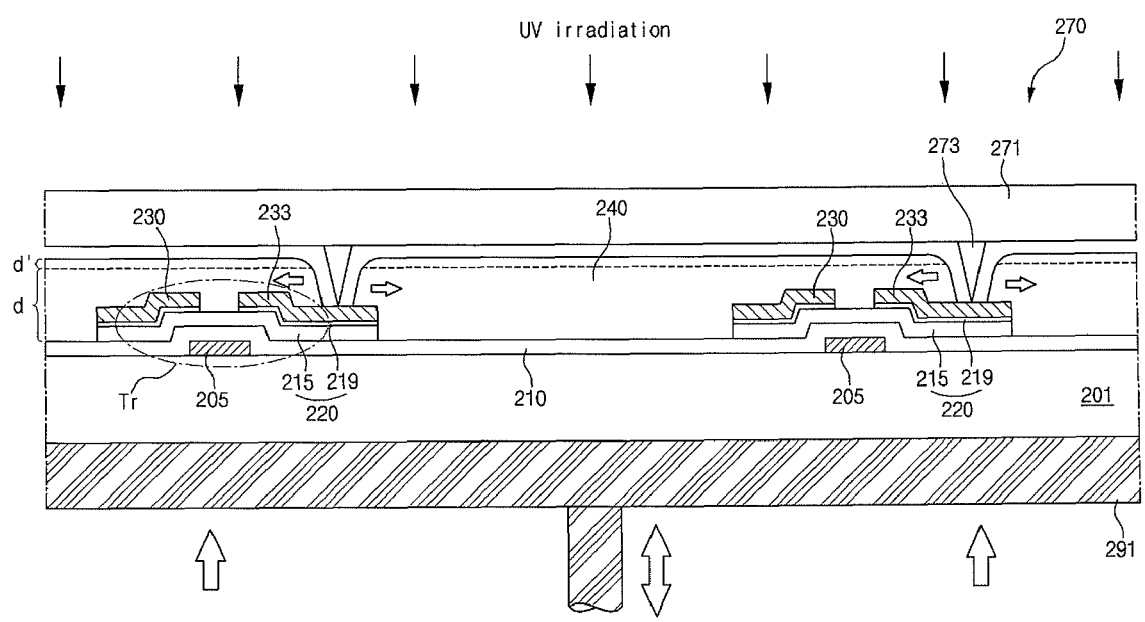
Figure 7G:
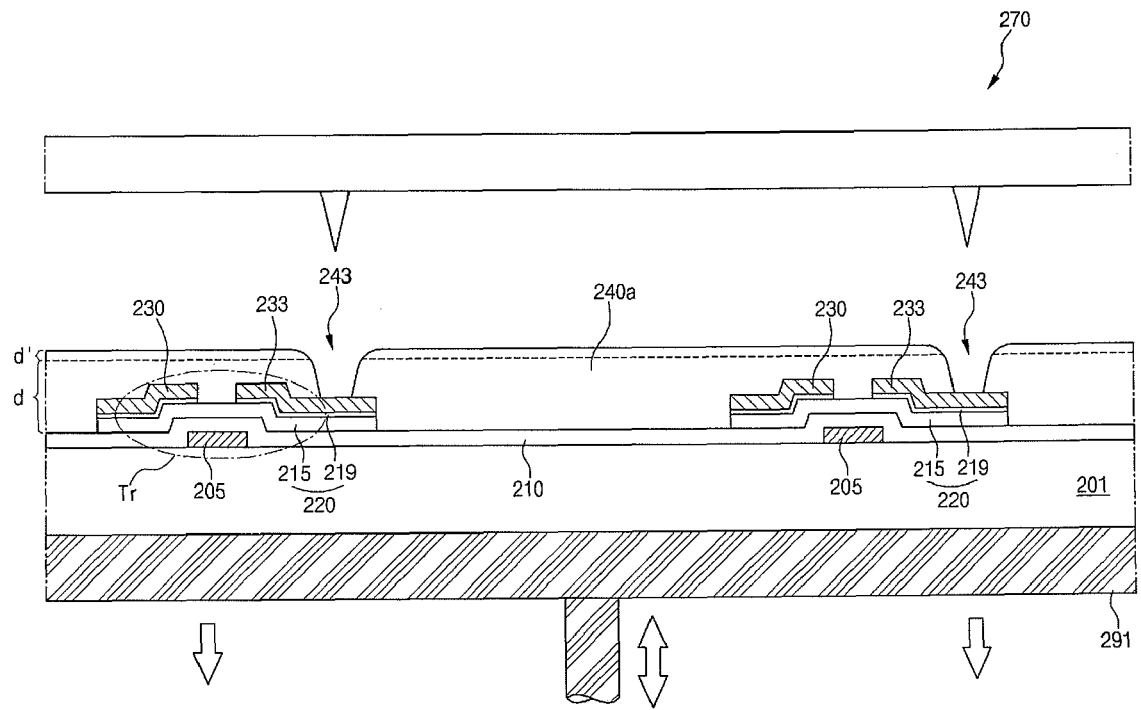
Figure 7H:
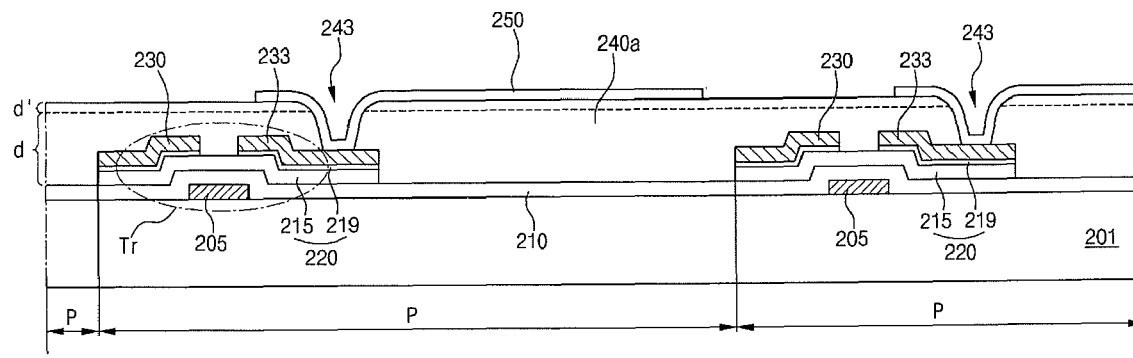
Figure 8A:
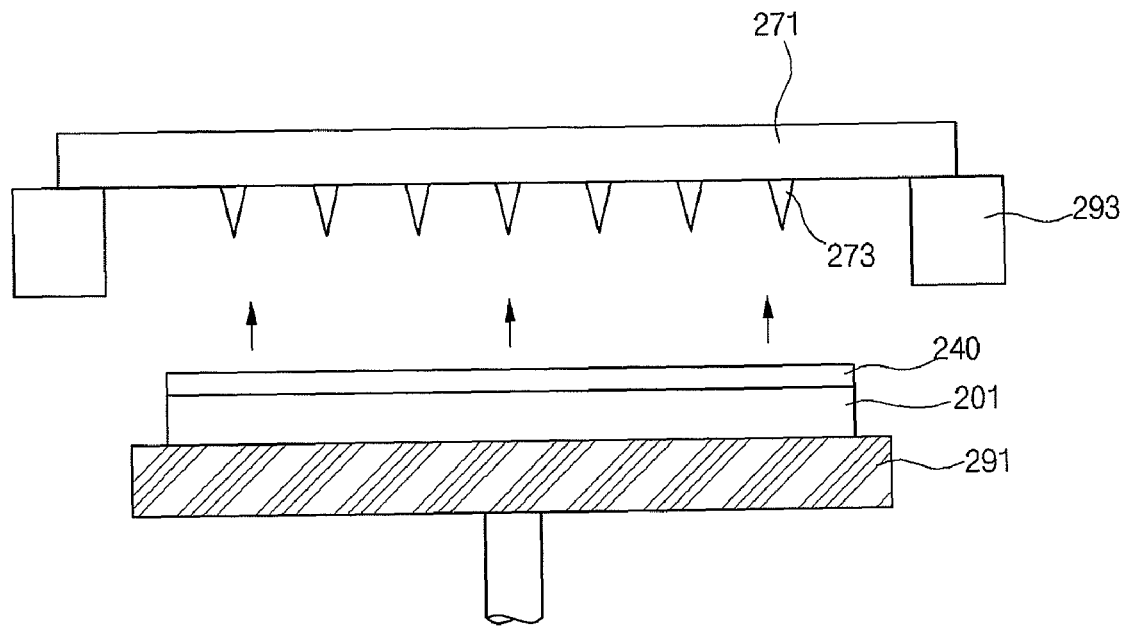
FIGS. 8A and 8B are cross-sectional views illustrating an in-plane printing method for forming a passivation layer of an array substrate according to an embodiment of the present invention.
Figure 8B:
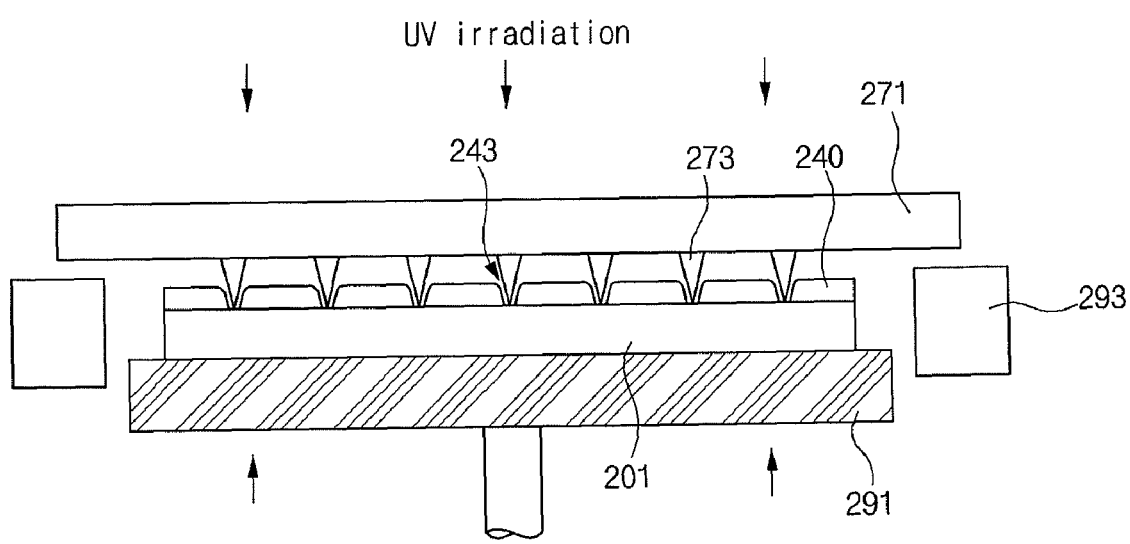

FIGS. 7A to 7H are cross-sectional views illustrating a method of fabricating an array substrate for an LCD device according to an embodiment of the present invention, and FIGS. 8A and 8B are cross-sectional views illustrating an in-plane printing method for forming a passivation layer of an array substrate according to an embodiment of the present invention. In FIGS. 7A to 7H, 8A and 8B, an insulating layer, i.e., a passivation layer including an organic insulating material is patterned through an in-plane printing method.

In FIG. 7A, a first metal layer (not shown) is formed on a substrate 201 having a pixel region P by depositing a first metallic material such as aluminum (Al), aluminum (Al) alloy, copper (Cu), copper (Cu) alloy and molybdenum (Mo). A gate line (not shown) and a gate electrode 205 connected to the gate line are formed through a photolithographic process including steps of coating photoresist (PR), exposing a PR layer through a photo mask, developing the PR layer to form a PR pattern, etching and stripping the PR pattern. The gate line and the gate electrode 205 may include a double layered structure by sequentially depositing at least two of the first metallic material.

In FIG. 7B, a gate insulating layer 210, an intrinsic amorphous silicon layer (not shown), an impurity-doped amorphous silicon layer (not shown) and a second metal layer (not shown) are sequentially formed on the gate line and the gate electrode 205. The gate insulating layer 210 includes an inorganic insulating material such as silicon oxide ($SiO_2$) and silicon nitride ($SiN_x$), and the second metal layer includes a second metallic material such as molybdenum (Mo) and chromium (Cr). A PR layer (not shown) is formed on the second metal layer by coating a PR material, and first and second PR patterns 281a and 281b are formed by exposing and developing the PR layer using a photo mask. The first PR pattern 281a has a first thickness and the second PR pattern 281b has a second thickness smaller than the first thickness.

The second metal layer, the impurity-doped amorphous silicon layer and the intrinsic amorphous silicon layer are sequentially etched using the first and second PR patterns 281a and 281b as an etch mask to form an active layer 215, an ohmic contact pattern 218 and a source drain pattern 225 over the gate electrode 205. Accordingly, the active layer 215 and the ohmic contact pattern 218 include intrinsic amorphous silicon and impurity-doped amorphous silicon, respectively. A data line (not shown) crossing the gate line to define the pixel region P is formed at the same time.

In FIG. 7C, the second PR pattern 281b (of FIG. 7B) is removed by ashing to expose the source drain pattern 225 (of FIG. 7B) through first PR pattern 281a. Next, the source drain pattern 225 and the ohmic contact pattern 218 (of FIG. 7B) are dry-etched using the first PR pattern 281a as an etch mask to form a source electrode 230, a drain electrode 233 and an ohmic contact layer 219. The source electrode 230 is connected to the data line (not shown) and the drain electrode 233 is spaced apart from the source electrode 230. As a result, the ohmic contact layer 219 is formed on the active layer 215 and the source and drain electrodes 230 and 233 are formed on the ohmic contact layer 219. The active layer 215 and the ohmic contact layer 219 may be referred to as a semiconductor layer 220. In addition, the gate electrode 205, the active layer 215, the ohmic contact layer, the source electrode 230 and the drain electrode 233 constitute a thin film transistor (TFT) Tr.

In FIG. 7D, the first PR pattern 281b (of FIG. 7C) is removed by stripping. Next, an organic insulating material layer 240 is formed on the source electrode 230, the drain electrode 233 and the data line by coating an organic insulating material. The organic insulating material has elasticity and dynamic stability and includes one of benzocyclobutene (BCB), photo acryl and liquid precursor of large molecule. The organic insulating material layer 240 has a third thickness d (of FIG. 7E) with respect to a top surface of the gate insulating layer 210. The liquid precursor of large molecule may include about 70% to about 90% by weight of a first precursor having a single reactor, about 7% by weight to about 27% by weight of a second precursor having one of double and triple functional groups, and less than about 3% by weight of a photo initiator. The first and second precursors have a photo curability, and a sum of composition ratios of the first precursor, the second precursor and the photo initiator constitutes about 100% by weight.

In FIGS. 7E and 8A, the substrate 291 having the TFT Tr and the organic insulating material layer 240 is disposed on a stage 291 and a hard type or a soft type stamp 270 having a base substrate 271 and a plurality of convex portions 273 is disposed over the organic insulating material layer 240 such that the plurality of convex portions 273 face into the organic insulating material layer 240. The stamp 270 is supported by a supporting unit 293 contacting the base substrate 271 at a boundary portion thereof. Next, the stage 291 having the substrate 201 thereon gradually moves up toward the stamp 270 so that the plurality of convex portions 273 can be inserted into the organic insulating material layer 240.

In FIGS. 7F and 8B, summits of the plurality of convex portions 273 of the stamp 270 reach a bottom surface of the organic insulating material layer 240 to contact the drain electrode 233 beneath the organic insulating material layer 240. The stage 291 keeps moving up even after the plurality of convex portions 273 contact the drain electrode 233. Since the plurality of convex portions 273 have rigidity, the stamp 270 is supported by the stage 291 through the plurality of convex portions 273 and the substrate 201 instead of the supporting unit 293. As a result, the stamp 270 is spaced apart form the supporting unit 293 and moves up with the stage 291. The contact between the plurality of convex portions 273 and the drain electrode 233 may be detected by the separation of the stamp 270 and the supporting unit 293. When the summits of the plurality of convex portions 273 contact the drain electrode 233, the organic insulating material layer 240 is pushed out from the summits of the plurality of convex portions 273 by a dewetting phenomenon. In addition, an ultra violet (UV) light is irradiated onto the organic insulating material layer 240 through the stamp 270 when the organic insulating material layer 240 is pushed out from the summits of the plurality of convex portions 273, thereby curing the organic insulating material layer 240 to form a drain contact hole.

In the in-plane printing process of FIGS. 7E and 7F, the stamp 270 is pressurized by a mass thereof without an additional pressure, and the organic insulating material layer 240 is cured by UV irradiation when the contact between the plurality of convex portions 273 and the drain electrode 233 is detected, i.e., when the stamp 270 is separated from the supporting unit 293. In the in-plane printing process according to another embodiment, the stamp 270 may be pressurized by the mass thereof and an additional pressure while the stamp 270 is separated from the supporting unit 293. For example, the additional pressure may be greater than about 0 ATM and less than about 10 ATM in order not to deteriorate the elements of the substrate 201 such as the drain electrode 233. Accordingly, the additional pressure may be applied using a soft type stamp rather than a hard type stamp.

Moreover, the stamp 270 may have a surface energy less than about 25 mJ/m$^2$ and the organic insulating material layer 240 may have a surface tension less than about 40 mN/m to improve the dewetting phenomenon when the plurality of convex portions 273 of the stamp 270 contact the drain electrode 233 beneath the organic insulating material layer 240. When the surface energy of the stamp 270 is greater than about 25 mJ/m$^2$ and the surface tension of the organic insulating material layer 240 is greater than about 40 mN/m, the dewetting phenomenon seldom occurs or the dewetting phenomenon has a very short time period for the UV irradiation. As a result, a hole is not formed in the organic insulating material layer 240.

When each convex portion 273 of stamp 270 has one of a quadrangular pyramid shape 103a (of FIG. 4A), a triangular pyramid shape 103b (of FIG. 4B) and a cone shape 103c (of FIG. 4C), the stamps 270 of a hard type satisfying the equations 1, 2 and 3, respectively, are used in the in-plane printing method. Since each convex portion 273 of the stamps 270 satisfying the equations 1, 2 and 3, respectively, has a height greater than an increased thickness d+d', the base substrate 271 of the stamps 270 does not contact the top surface of the organic insulating material layer 240.

Furthermore, when each convex portion 273 of stamp 270 has one of a truncated quadrangular pyramid shape 113a (of FIG. 6A), a truncated triangular pyramid shape 113b (of FIG. 6B) and a truncated cone shape 113c (of FIG. 6C), the base substrate 271 of the stamps 270 of a soft type contacts the organic insulating material layer 240 having an increased thickness d+d'. However, the summits of the plurality of convex portions 273 contact the drain electrode 233 by an additional pressure, and the dewetting phenomenon occurs. Here, since the plurality of convex portions 273 has elasticity, the drain electrode 233 is not deteriorated even by the additional pressure. In addition, since a contact area is adjusted by the additional pressure in the soft type stamp, a size of a contact hole may be adjusted.

In FIG. 7G, the stamp 270 is removed from the organic insulating material layer 240, and a drain contact hole 243 exposing the drain electrode 233 is formed in the organic insulating material layer 240. As a result, a passivation layer 240a having the drain contact hole 243 is completed.

In FIG. 7H, a pixel electrode 250 is formed on the passivation layer 240a by depositing and patterning a transparent conductive material such as indium-tin-oxide (ITO) and indium-zinc-oxide (IZO). The pixel electrode 250 is connected to the drain electrode 233 through the drain contact hole 243.

FIGS. 9A to 9F are cross-sectional views illustrating a method of fabricating an array substrate for an LCD device according to another embodiment of the present invention. In FIGS. 9A to 9F, an insulating layer, i.e., a passivation layer including an inorganic insulating material is patterned through an in-plane printing method. Since steps of forming a thin film transistor and an insulating layer are the same as those of FIGS. 7A to 7D, illustrations for those steps will be omitted.

Figure 9A:
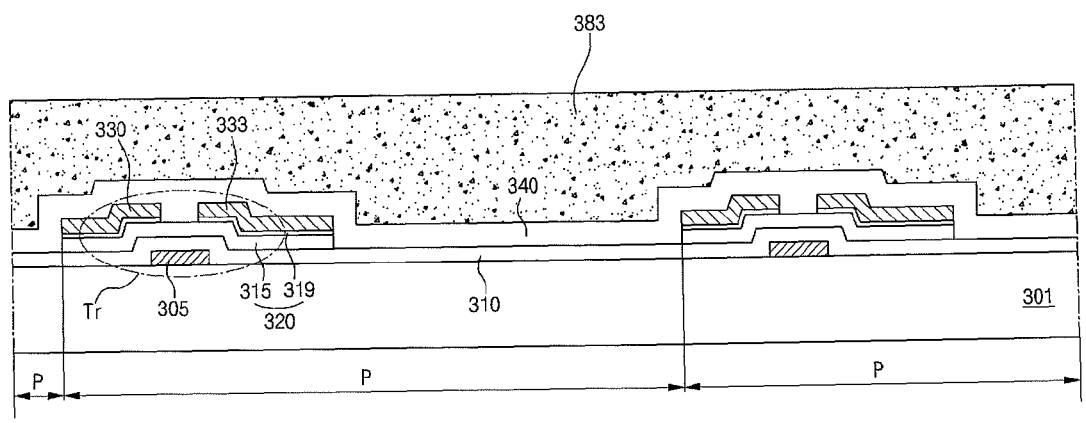
FIGS. 9A to 9F are cross-sectional views illustrating a method of fabricating an array substrate for an LCD device according to another embodiment of the present invention.

In FIG. 9A, an inorganic insulating material layer 340 is formed on a thin film transistor (TFT) Tr and the data line (not shown) on a substrate 391 by depositing an inorganic insulating material such as silicon oxide ($SiO_2$) and silicon nitride ($SiN_x$). A photoresist (PR) layer 383 is formed on the inorganic insulating material layer 340 by coating. The PR layer 383 may include a negative type PR material where an exposed portion thereof is cured and remains after development.

Figure 9B:
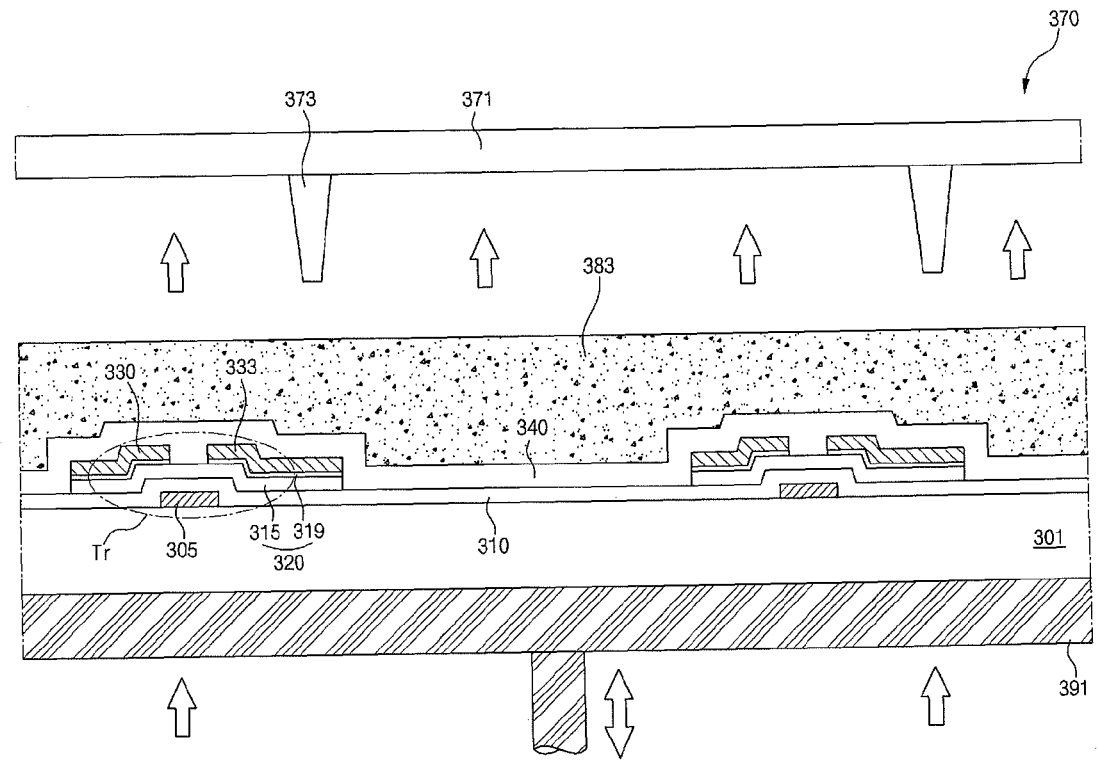

In FIG. 9B, the substrate 391 having the inorganic insulating material layer 340 and the PR layer 383 is disposed on a stage 391 and a hard type or a soft type stamp 370 having a base substrate 371 and a plurality of convex portions 373 is disposed over the PR layer 383 such that the plurality of convex portions 373 face into the PR layer 383. Here, a conventional baking step for curing the PR layer 383 is omitted so that the PR layer can have fluidity.

Figure 9C:
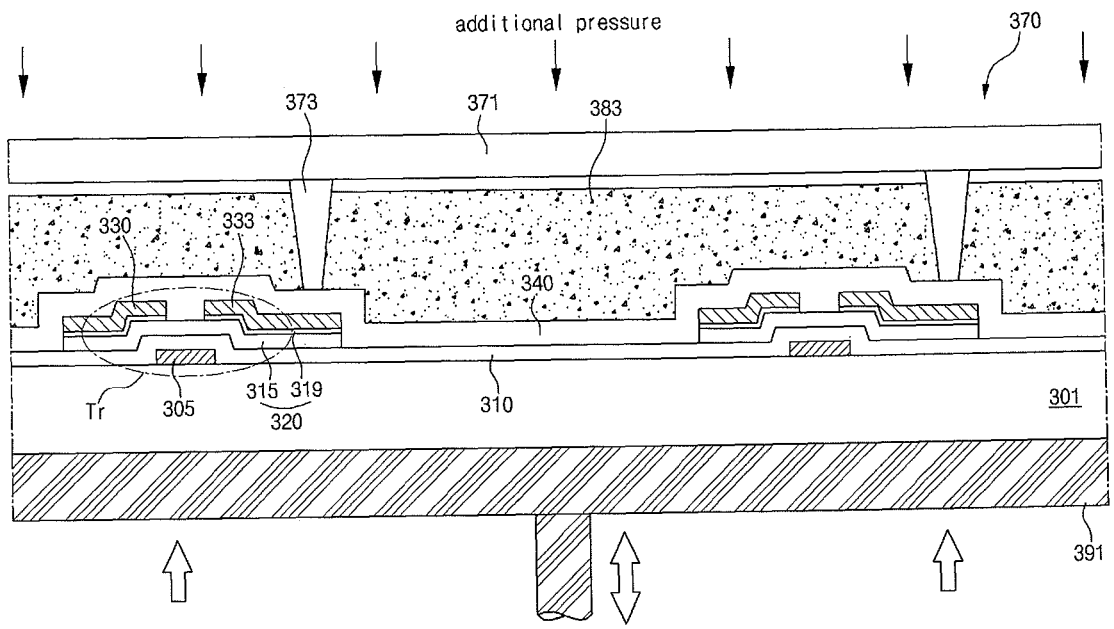

In FIG. 9C, the stage 391 having the substrate 301 thereon gradually moves up toward the stamp 370 so that the plurality of convex portions 373 can be inserted into the PR layer 383. Summits of the plurality of convex portions 373 of the stamp 370 reach a bottom surface of the PR layer 383 to contact the inorganic insulating material layer 340 beneath the PR layer 383. When the summits of the plurality of convex portions 373 contact the inorganic insulating material layer 340, the PR layer 383 is pushed out from the summits of the plurality of convex portions 383 by a dewetting phenomenon. Specifically for a soft type, the stamp 370 may be pressurized by an additional pressure as well as a mass thereof. Since the inorganic insulating material layer 340 has rigidity, a drain contact hole may not be formed in the inorganic insulating material layer 340 even when the stamp 370 is pressurized by the mass and the additional pressure. Alternatively, the additional pressure may be omitted especially for a hard type stamp.

Figure 9D:
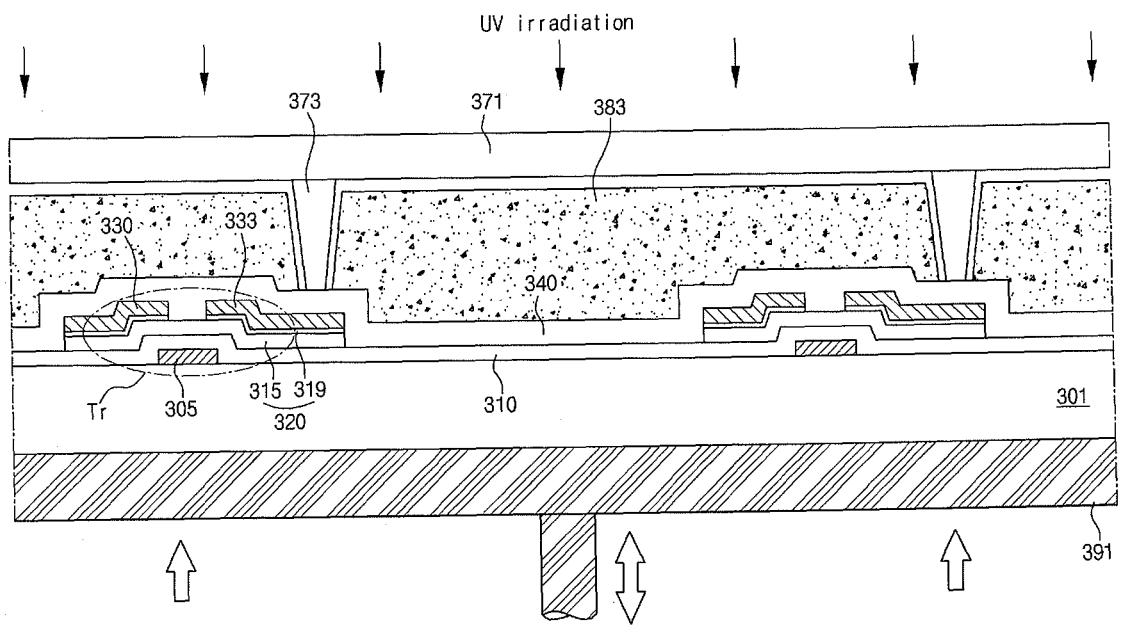

In FIG. 9D, an ultraviolet (UV) ray is irradiated onto the PR layer 383 through the stamp 370 while the PR layer 383 is pushed out from the summits of the plurality of convex portions 373, thereby curing the PR layer 383 to form an opening. The opening in the PR layer 383 may expose the inorganic insulating material layer 340 or may have a thin PR film at a bottom portion thereof to cover the inorganic insulating material layer 340. The thin PR film may be removed in a subsequent ashing step.

The opening having the thin PR film is formed in the PR layer 383 using a hard type stamp of FIGS. 4A to 4C when a UV light is irradiated onto the PR layer 383 without occurrence of dewetting phenomenon due to contact between the plurality of convex portions 373 and the inorganic insulating material layer 340. The opening has an intaglio pyramid shape corresponding to each convex portion 373 and the bottom of the intaglio pyramid shape is very sharp and small. As a result, a sufficient process time for the subsequent ashing step is required for a designed contact area.

The process time for the subsequent ashing step is reduced by using a soft type stamp of FIGS. 6A to 6C. Since each convex portion 373 of the soft type stamp 370 has a truncated pyramid shape, the opening in the PR layer 383 has an intaglio truncated pyramid shape and the bottom of the intaglio truncated pyramid shape is flat. Since the thin PR film formed by the soft type stamp has an area greater than the thin PR film formed by the hard type stamp, the process time for the subsequent ashing step of removing the thin PR film is reduced.

Figure 9E:
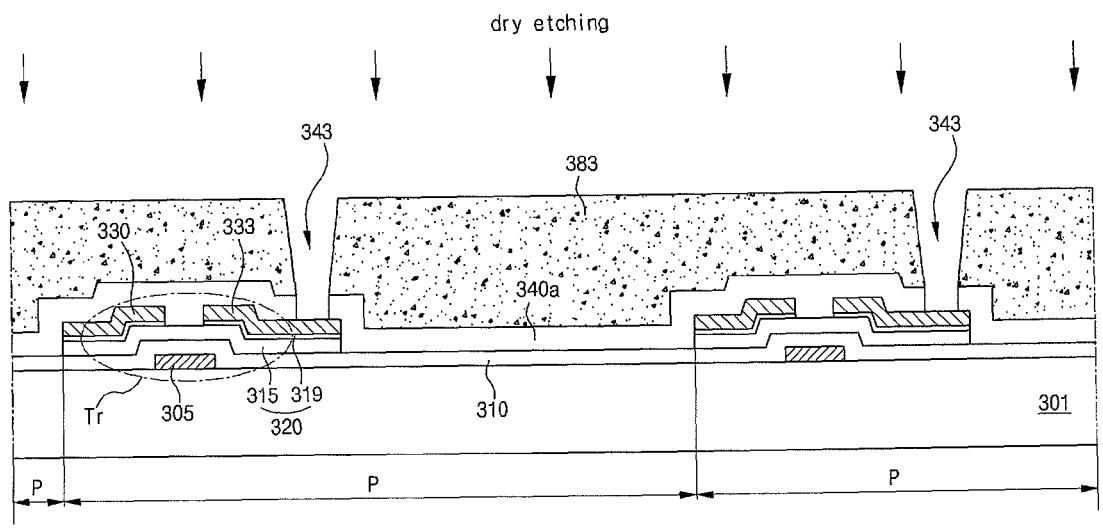

In FIG. 9E, the stamp is removed from the PR layer 383, and the inorganic insulating material layer 340 is patterned using the PR layer 383 as an etch mask to form a drain contact hole 343 exposing the drain electrode 333 in the inorganic insulating material layer 340. When the opening of the PR layer 383 has a thin PR film, an ashing step of partially removing the PR layer 383 to remove the thin PR film is performed to expose the inorganic insulating material layer 340 before etching of the inorganic insulating material layer 340. As a result, a passivation layer 340a having the drain contact hole 343 is completed.

Figure 9F:
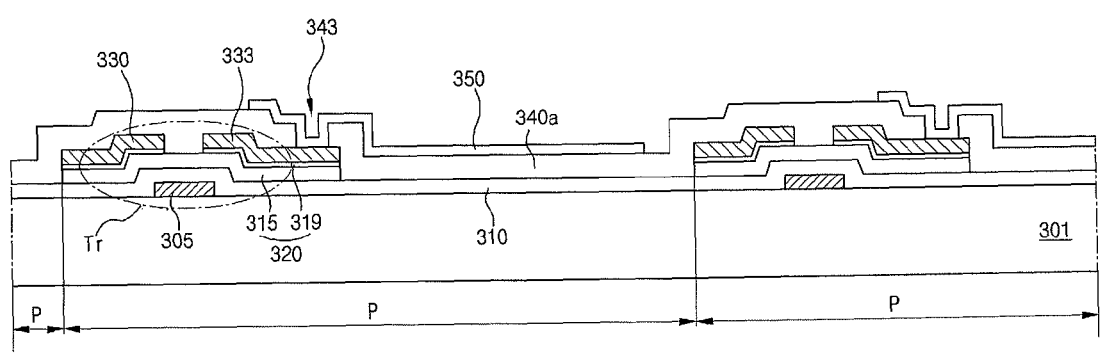

In FIG. 9F, after the PR layer 383 (of FIG. 9E) on the passivation 340a (of FIG. 9E) is removed through stripping, a pixel electrode 350 is formed on the passivation layer 340a by depositing and patterning a transparent conductive material such as indium-tin-oxide (ITO) and indium-zinc-oxide (IZO). The pixel electrode 350 is connected to the drain electrode 333 through the drain contact hole 343.

According to embodiments of the present invention, since an array substrate for an LCD device is fabricated through the in-plane printing method using the stamp instead of an expensive photo mask, a mask process including steps of coating a PR material, exposing through a photo mask, developing, etching and stripping is omitted or an exposure step using an expensive apparatus is omitted. As a result, production cost and production time are reduced, and productivity is improved by simplifying fabrication process.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate for a liquid crystal display device, the method comprising:
    forming a gate line, a data line that crosses the gate line and a thin film transistor connected to the gate line and the data line on a substrate;
    forming an organic insulating material layer on the gate line, the data line and the thin film transistor, the organic insulating material layer having photo curability, flexibility and dynamic stability;
    forming a passivation layer that has a drain contact hole from the organic insulating material layer by using a stamp that has a convex portion, the drain contact hole exposing a drain electrode of the thin film transistor, wherein the stamp comprises a base substrate of a first transparent material and the convex portion of a second transparent material on the base substrate; and
    forming a pixel electrode on the passivation layer, the pixel electrode connected to the drain electrode through the drain contact hole.

2. The method according to claim 1, wherein the forming a passivation layer step comprises:
    disposing the stamp that has the convex portion over the organic insulating material layer;
    inserting the convex portion into the organic insulating material layer; and
    removing the stamp from the organic insulating material layer.

3. The method according to claim 2, further comprising curing the organic insulating material layer before the removing the stamp step.

4. The method according to claim 2, wherein the inserting the convex portion into the organic insulating material layer step comprises contacting the convex portion and the organic insulating material layer to push out the organic insulating material layer from the convex portion.

5. The method according to claim 2, wherein the step of inserting the convex portion into the organic insulating material layer comprises:
    moving the substrate toward the stamp; and
    pressurized the stamp toward the substrate with a pressure.

6. The method according to claim 5, wherein the pressure is greater than about 0 ATM and less than about 10 ATM.

7. The method according to claim 2, wherein the step of disposing the stamp comprises supporting the stamp with a supporting unit at a boundary of the stamp.

8. The method according to claim 7, wherein the step of irradiating a ultraviolet ray is performed after the stamp is separated from the supporting unit.

9. The method according to claim 1, wherein the stamp has a surface energy less than about 25 $mJ/m^2$ and the organic insulating material layer has a surface tension less than about 40 mN/m.

10. The method according to claim 1, wherein the first transparent material is selected from a group consisting of glass, quartz and polyurethane acrylate.

11. The method according to claim 1, wherein the convex portion and the organic insulating material layer satisfy a relation of:
    $h>3d$, when the convex portion has a quadrangular pyramid shape that has a height h;
    $s>3\sqrt{(6)}d$, when the convex portion has a rectangular tetrahedron shape that has a side s; and
    $h>12d/\pi$, when the convex portion has a cone shape that has a height h, where the organic insulating material layer has a thickness d.

12. The method according to claim 1, wherein the second transparent material of the convex portion has an elasticity.

13. The method according to claim 12, wherein the convex portion has a shape selected from a group consisting of a quadrangular pyramid shape, a regular tetrahedron shape, a cone shape, a truncated quadrangular pyramid shape, a truncated triangular pyramid shape and a truncated cone shape.

14. The method according to claim 12, wherein the second transparent material comprises polydimethylsiloxane.

15. A method of fabricating an array substrate for a liquid crystal display device, the method comprising:
    forming a gate line, a data line that crosses the gate line and a thin film transistor connected to the gate line and the data line on a substrate;
    forming an inorganic insulating material layer on the gate line, the data line and the thin film transistor;
    forming a photoresist layer on the inorganic insulating material layer;
    forming an opening in the photoresist layer by using a stamp that has a convex portion, wherein the stamp comprises a base substrate of a first transparent material and the convex portion of a second transparent material on the base substrate;

patterning the inorganic insulating material layer using the photoresist layer with the opening as an etch mask to form a passivation layer that has a drain contact hole, the drain contact hole exposing a drain electrode of the thin film transistor;

removing the photoresist layer; and forming a pixel electrode on the passivation layer, the pixel electrode connected to the drain electrode through the drain contact hole.

16. The method according to claim 15, wherein the forming an opening in the photoresist layer step comprises:

disposing the stamp that has the convex portion over the photoresist layer;

inserting the convex portion into the photoresist layer; and removing the stamp from the photoresist layer.

17. The method according to claim 16, further comprising curing the photoresist layer before the removing the stamp step.

18. The method according to claim 16, wherein the step of inserting the convex portion into the photoresist layer comprises contacting the convex portion and the inorganic insulating material layer to push out the photoresist layer from the convex portion.

19. The method according to claim 15, further comprising partially removing the photoresist layer by ashing.

20. A method of forming a hole in a layer, the method comprising:

forming an organic insulating material layer on a substrate, the organic insulating material layer having photo curability, flexibility and dynamic stability;

contacting a stamp that has a convex portion and the organic insulating material layer to push out the organic insulating material layer from the convex portion, wherein the stamp comprises a base substrate of a first transparent material and the convex portion of a second transparent material on the base substrate; and removing the stamp from the organic insulating material layer.

21. The method according to claim 20, wherein the contacting step comprises:

disposing the stamp that has the convex portion over the organic insulating material layer;

inserting the convex portion into the organic insulating material layer to push out the organic insulating material layer from the convex portion; and curing the organic insulating material layer after the inserting step.

22. A method of forming a hole in a layer, the method comprising:

forming an inorganic insulating material layer on a substrate;

forming a photoresist layer on the inorganic insulating material layer;

forming an opening in the photoresist layer by using a stamp that has a convex portion, wherein the stamp comprises a base substrate of a first transparent material and the convex portion of a second transparent material on the base substrate;

patterning the inorganic insulating material layer using the photoresist layer with the opening as an etch mask; and removing the photoresist layer.

23. The method according to claim 22, wherein the forming an opening in the photoresist layer step comprises:

disposing the stamp that has the convex portion over the photoresist layer;

inserting the convex portion into the photoresist layer; and removing the stamp from the photoresist layer.

24. The method according to claim 23, further comprising curing the photoresist layer before the removing the stamp step.

* * * * *